United States Patent
Lin et al.

(10) Patent No.: US 6,808,995 B2
(45) Date of Patent: Oct. 26, 2004

(54) SEMICONDUCTOR DEVICE WITH MINIMAL SHORT-CHANNEL EFFECTS AND LOW BIT-LINE RESISTANCE

(75) Inventors: Hung-Sui Lin, Tainan (TW); Han Chao Lai, Taichung (TW); Tao Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/361,681

(22) Filed: Feb. 11, 2003

(65) Prior Publication Data

US 2003/0178624 A1 Sep. 25, 2003

Related U.S. Application Data

(62) Division of application No. 10/101,930, filed on Mar. 21, 2002, now Pat. No. 6,555,844.

(51) Int. Cl.$^7$ ............................................. H01L 21/336
(52) U.S. Cl. ....................... 438/296; 438/294; 438/424; 438/542; 438/593; 438/761
(58) Field of Search ................................ 438/761, 593, 438/542, 296, 294, 424, 284; 257/397, 510, 472, 413, 374

(56) References Cited

U.S. PATENT DOCUMENTS

| | | | |
|---|---|---|---|
| 4,498,951 A | * | 2/1985 | Tamura et al. ............... 156/612 |
| 6,107,129 A | | 8/2000 | Gardner et al. |
| 6,172,402 B1 | | 1/2001 | Gardner et al. |
| 6,180,465 B1 | | 1/2001 | Gardner et al. |
| 6,187,620 B1 | | 2/2001 | Fulford, Jr. et al. |
| 6,346,466 B1 | * | 2/2002 | Avanzino et al. ........... 438/584 |

OTHER PUBLICATIONS

Wolf, S., "Short–Channel Effects and how They Impact MOS Processing". Silicon Processing for the VLSI Era–Process Integration, pp. 338–367, vol. II, 1990.

* cited by examiner

*Primary Examiner*—Steven Loke
*Assistant Examiner*—Thomas Magee
(74) *Attorney, Agent, or Firm*—Finnegan, Henderson, Farabow, Garrett & Dunner, L.L.P.

(57) ABSTRACT

A transistor device that includes at least two transistors, each transistor including a source region, a drain region, and a shallow trench isolation formed between and contiguous with the source and drain regions, wherein the shallow trench isolation electrically isolates the source and drain regions to minimize the short-channel effects, a conductor layer disposed over the source region, shallow trench isolation, and drain region, wherein the conductor layer electrically connects the source and drain regions to serve as a channel region, a gate oxide disposed over the conductor layer, and a gate structure formed over the gate oxide.

11 Claims, 1 Drawing Sheet

SEMICONDUCTOR DEVICE WITH MINIMAL SHORT-CHANNEL EFFECTS AND LOW BIT-LINE RESISTANCE

This is a division of application Ser. No. 10/101,930 filed Mar. 21, 2002 now U.S. Pat. No. 6,555,844

DESCRIPTION OF THE INVENTION

1. Field of the Invention

This invention relates in general to a semiconductor device and, more particularly, to a semiconductor structure for minimizing and eliminating short-channel effects, and providing decreased bit line resistance.

2. Background of the Invention

Device characteristics of conventional metal-oxide-silicon field-effect transistors (MOSFETs), such as threshold voltage and subthreshold current, generally may be predicted through mathematical formulas. However, a trend in modern integrated circuit manufacture is to produce MOSFETs with reduced feature sizes, one such size being the channel length. As the channel length is reduced to the same dimension as the widths of the source and drain depletion regions of a MOSFET, some of the charges in the channel region may become linked to the charges in the source and/or drain depletion regions. As a result, the channel may become partially depleted, skewing the threshold voltage and other device characteristics of the MOSFET. This is known as short-channel effects.

A known phenomenon associated with the short-channel effects is the unintended injection of hot carriers. These unintended carriers are injected into the gate structure, altering the threshold voltage of the MOSFET. As the channel length decreases below 2 $\mu$m, the device characteristics become so influenced by the short-channel effects that they can no longer be accurately predicted through mathematical formulas.

A number of prior art devices have been proposed to address the short-channel effects. Some have proposed reducing the dimensions of the source and drain depletion regions. Such a reduction, however, has an unintended adverse effect of increasing bit line resistance.

SUMMARY OF THE INVENTION

In accordance with the invention, there is provided a semiconductor device that includes a substrate having a source region, a drain region, and a shallow trench isolation formed between and contiguous with the source and drain regions, wherein the shallow trench isolation electrically isolates the source and drain regions, a conductor layer disposed over the substrate, wherein the conductor layer overlaps the source region, shallow trench isolation, and drain region, a gate oxide disposed over the conductor layer, and a gate structure formed over the gate oxide, wherein the gate, source region, and drain region form a transistor.

In one aspect, the conductor layer electrically connects the source and drain regions to serve as the channel region of the transistor.

Also in accordance with the present invention, there is provided a semiconductor device that includes at least two transistors, each transistor including a source region, a drain region, and a shallow trench isolation formed between and contiguous with the source and drain regions, wherein the shallow trench isolation electrically isolates the source and drain regions; a conductor layer disposed over the source region, shallow trench isolation, and drain region, wherein the conductor layer electrically connects the source and drain regions to serve as a channel region; a gate oxide disposed over the conductor layer; and a gate structure formed over the gate oxide, wherein the source region, drain region, and the gate structure form a transistor.

Additionally in accordance with the present invention, there is provided a semiconductor device that includes a first transistor including, a first diffused region, a second diffused region formed spaced apart from the first diffused region, a first shallow trench isolation disposed between and contiguous with the first and second diffused regions, wherein the first shallow trench isolation electrically isolates the first and second diffused regions, a first conductor layer formed over the first diffused region, the first shallow trench isolation, and the second diffused region, a first gate oxide disposed over the first conductor layer, and a first gate structure formed over the first gate oxide. There is also provided a second transistor formed adjacent the first transistor that includes a third diffused region formed spaced apart from the first diffused region, a fourth diffused region formed spaced apart from the third diffused region, a second shallow trench isolation disposed between and contiguous with the third and fourth diffused regions, and formed spaced apart from the first shallow trench isolation, wherein the second shallow trench isolation electrically isolates the third and fourth diffused regions, a second conductor layer formed spaced apart from the first conductor layer, and over the third diffused region, the second shallow trench isolation, and the fourth diffused region, a second gate oxide disposed over the second conductor layer, and a second gate structure formed over the second gate oxide.

In one aspect, the first and second diffused regions form the source and drain regions of the first transistor.

In another aspect, the second and third diffused regions are the same diffused region.

In yet another aspect, there additionally includes a third conductor layer formed contiguous with the first conductor layer and disposed over one of the first and second diffused regions, wherein the third conductor layer is doped with a same type of impurity as one of the first and second diffused regions.

Further in accordance with the present invention, there is provided a method for minimizing short-channel effects in a transistor that includes providing a substrate, providing a source region and a drain region in the substrate, providing a shallow trench isolation between and contiguous with the source and drain regions, wherein the shallow trench isolation electrically isolates the source and drain regions, providing a conductor layer over the substrate, wherein the conductor layer overlaps the source region, shallow trench isolation, and drain region, providing a gate oxide over the conductor layer, and providing a gate structure over the gate oxide, wherein the gate structure, source region and drain region form a transistor.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiment of the invention, examples of which are illustrated in the accompanying drawings. Wherever possible, the same reference numbers will be used throughout the drawings to refer to the same or like parts.

The present invention provides a transistor, such as a MOSFET, with minimal short-channel effects without increasing bit line resistance. This is achieved by providing shall trench isolations (STIs) between source and drain regions. The present invention would also allow the dimensions of the drain and source regions to be increased, thereby decreasing bit line resistance. In addition, the present invention may be manufactured using conventional CMOS processes.

Figure 1:
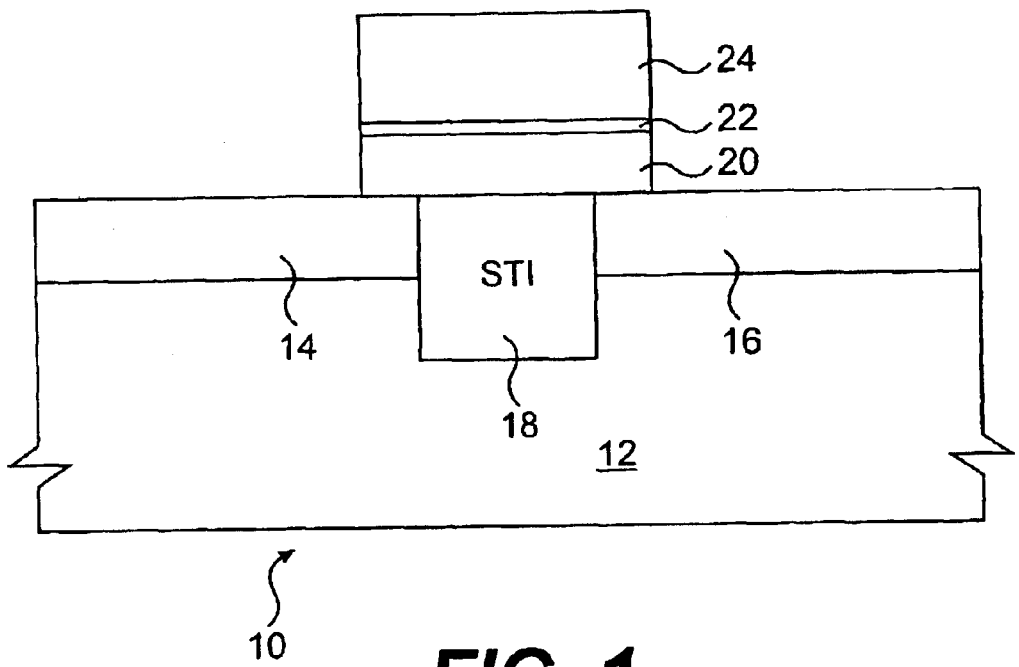
FIG. 1 is a cross-sectional view of a transistor consistent with one embodiment of the present invention.

FIG. 1 is a cross-sectional view of a transistor 10 consistent with one embodiment of the present invention. Referring to FIG. 1, the transistor 10 includes a substrate 12 having a source region 14 and a drain region 16. Each of the source and drain regions may also be referred to as a depletion region. The substrate 12 also includes an STI 18 formed between and contiguous with the source region 14 and drain region 16. The STI 18 functions to electrically isolate the source region 14 and drain region 16 to minimize and eliminate the short-channel effects as the critical dimensions of the transistor 10 are reduced. In addition, with the STI 18 formed therebetween, the dimensions of the source region 14 and drain region 16 need not be reduced to control the short-channel effects. The STI 18 may be formed with any conventional process steps. As an example, a shallow trench is first formed in the substrate 12 and then filled with a dielectric material such as silicon nitride and silicon dioxide. A planarization step, such as chemical-mechanical polishing, may follow to obtain a substantially planar substrate surface.

A conductor layer 20 is formed over the substrate 12. The conductor layer 20 may comprise of any conducting material, including, for example, a silicon layer, epitaxial silicon layer, or polysilicon layer. The conductor layer 20 overlaps the source region 14, STI 18, and drain region 16. In one embodiment, the conductor layer 20 is an undoped epitaxial layer. Because the STI 18 electrically isolates the source region 14 and drain region 16, the conductor layer 20 electrically connects the source region 14 and drain region 16 to serve as the channel region of the transistor 10. A gate oxide 22 is disposed over the conductor layer 20, and a gate structure 24 is formed over the gate oxide 22 to complete the transistor 10. In one embodiment, the transistor 10 is a MOS transistor. In another embodiment, the transistor 10 is a MOSFET.

Figure 2:
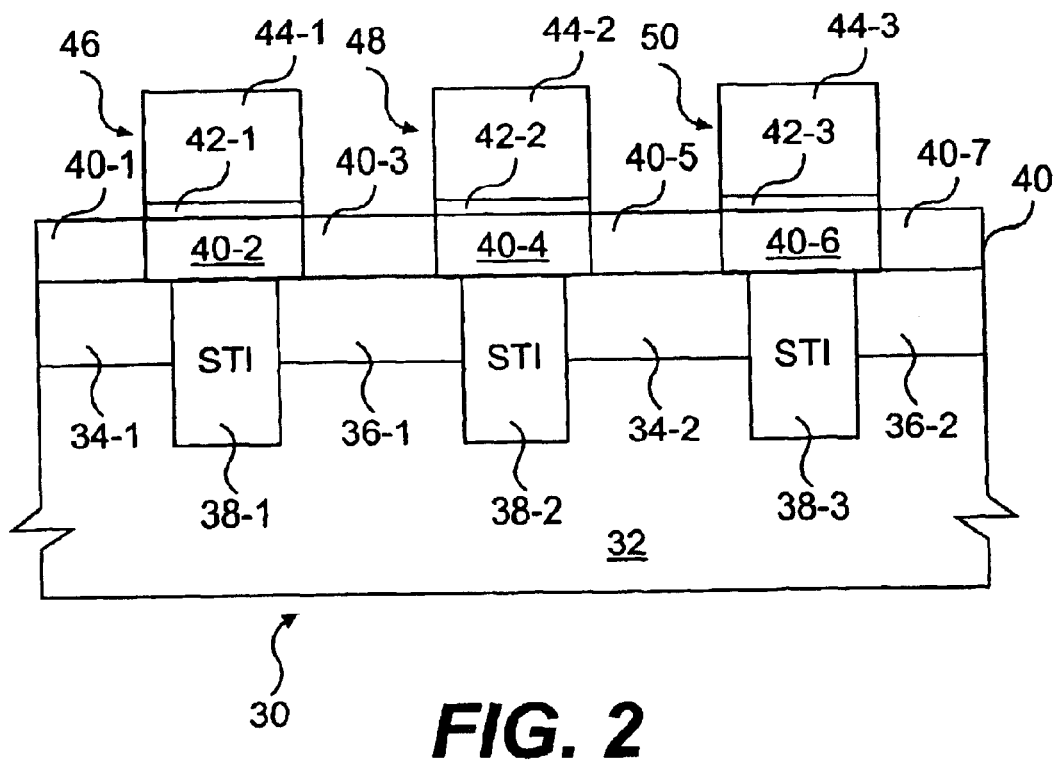
FIG. 2 is a cross-sectional view of a semiconductor device consistent with another embodiment of the present invention.

FIG. 2 is a cross-sectional view of a semiconductor device 30 with a transistor array (not numbered) consistent with another embodiment of the present invention. Referring to FIG. 2, the transistor array includes at least a first transistor 46, a second transistor 48, and a third transistor 50. Each transistor in the transistor array may be formed according to the transistor 10 shown and described in FIG. 1. Referring again to FIG. 2, the semiconductor device 30 includes a substrate 32 having a first diffused region 34-1 and a second diffused region 34-2. The substrate 32 also includes a third diffused region 36-1 spaced-apart from the first diffused region 34-1 and the second diffused region 34-2, and a fourth diffused region 36-2 spaced-apart from the second diffused region 34-2. Each of the first diffused region 34-1 and third diffused region 36-1 forms one of the source and drain regions of the first transistor 46. As is common with the usage of these term in the semiconductor industry, the terms "drain" and "source" are interchangeable. Each of the third diffused region 36-1 and second diffused region 34-2 form one of the source and drain regions of the second transistor 48. Thus, the first transistor 46 and second transistor 48 share a source/drain region. In addition, each of the second diffused region 34-2 and fourth diffused region 36-2 form one of the source and drain regions of the third transistor 50. Likewise, the second transistor 48 and third transistor 50 share a source/drain region.

The substrate 32 also includes a first STI 38-1, a second STI 38-2, and a third STI 38-3. The first STI 38-1 is disposed between and contiguous with the first diffused region 34-1 and third diffused region 36-1. The first STI 38-1 therefore functions to electrically isolate the source and drain regions of the first transistor 46. The second STI 38-2 is disposed between and contiguous with the third diffused region 36-1 and second diffused region 34-2. The second STI 38-2 functions to electrically isolate the source and drain regions of the second transistor 48. The third STI 38-3 is disposed between and contiguous with the second diffused region 34-2 and fourth diffused region 36-2. The third STI 38-3 functions to electrically isolate the source and drain regions of the third transistor 50. Therefore, the short-channel effects in each of the transistors 46, 48, and 50 may be minimized or eliminated without reducing the dimensions of their respective source and drain regions. As described above, the STIs 38-1, 38-2 and 38-3 may be formed with any conventional process steps, such as forming shallow trenches in the substrate 32 and filling the shallow trenches with dielectric materials such as silicon nitride and silicon dioxide.

A conductor layer 40 is formed over the substrate 32. The conductor layer 40 includes a plurality of sections 40-1 . . . 40-7. The conductor layer 40 may comprise of any conducting material, such as silicon, epitaxial silicon, and polysilicon. The second conductor section 40-2 overlaps the first diffused region 34-1 and third diffused region 36-1, and electrically connects the source and drain regions to serve as the channel region of the transistor 46. The fourth conductor section 40-4 overlaps the third diffused region 36-1 and second diffused region 34-2, and electrically connects the source and drain regions to serve as the channel region of the transistor 48. The sixth conductor section 40-6 overlaps the second diffused region 34-2 and fourth diffused region 36-2, and electrically connects the source and drain regions to serve as the channel region of the transistor 50. In one embodiment, the second, fourth, and sixth conductor sections 40-2, 40-4, and 40-6 are undoped.

The first conductor section 40-1 is disposed over the first diffused region 34-1, and the third conductor section 40-3 is disposed over the third diffused region 36-1. In addition, the fifth conductor section 40-5 is disposed over the second diffused region 34-2, and the seventh conductor section 40-7 is disposed over the fourth diffused region 36-2. In one embodiment, each of the first, third, fifth, and seventh conductor sections 40-1, 40-3, 40-5, and 40-7 is doped with the same type of impurity as the respective diffused regions 34-1, 36-1, 34-2, and 36-2 to increase the dimensions of the source and drain regions of the transistors 46, 48, and 50. Increased dimensions, in turn, decrease the resistance on the bit lines.

A first gate oxide 42-1 is disposed over the second conductor section 40-2. A second gate oxide 42-2 is disposed over the fourth conductor section 40-4. A third gate oxide 42-3 is disposed over the sixth conductor section 40-6. The first, second, and third gate oxides 42-1, 42-2, and 42-3 may also be a continuous oxide layer (not shown) disposed over the conductor layer 40. A first gate structure 44-1 is formed over the first gate oxide 42-1 to complete the first transistor 46. A second gate structure 44-2 is formed over the second gate oxide 42-2 to complete the second transistor 48. A third gate structure 44-3 is formed over the third gate oxide 42-3 to complete the third transistor 50.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for minimizing short-channel effects in a transistor, comprising:
   providing a substrate;
   providing a source region and a drain region in the substrate;
   providing a shallow trench isolation between and contiguous with the source and drain regions, wherein the shallow trench isolation electrically isolates the source and drain regions;
   providing a first conductor layer over the substrate, wherein the conductor layer overlaps the source region, shallow trench isolation, and drain region;
   providing a gate oxide over the conductor layer; and
   providing a gate structure over the gate oxide, wherein the gate structure, source region and drain region form a transistor.

2. The method of claim 1, wherein providing a conductor over the substrate comprises growing a layer of epitaxial silicon over the substrate.

3. The method of claim 1, further comprising forming a second conductor layer over and contiguous with one of the source and drain regions of the transistor.

4. The method of claim 3, further comprising forming a third conductor layer over and contiguous with the other of the source and drain regions of the transistor.

5. A method for minimizing short-channel effect in a semiconductor device, comprising:
   providing a substrate;
   forming a source region and a drain region for each of a first transistor and a second transistor;
   forming a first shallow trench isolation between and contiguous with the source region and the drain region of the first transistor, wherein the first shallow trench isolation electrically isolates the source and drain regions of the first transistor;
   forming a second shallow trench isolation between and contiguous with the source region and the drain region of the second transistor, wherein the second shallow trench isolation electrically isolates the source and drain regions of the second transistor;
   forming a first conductor layer over the first shallow trench isolation and a second conductor layer over the second shallow trench isolation, wherein the first conductor layer overlaps the source and drain regions of the first transistor, and the second conductor overlaps the source and drain region of the second transistor;
   depositing a first gate oxide over the first conductor layer and a second gate over the second conductor layer, and
   forming a first gate structure over the first gate oxide and a second gate structure over the second gate oxide.

6. The method of claim 5, wherein forming a source region and a drain region for each of the first and second transistors comprises forming a first diffused region, a second diffused region, and a third diffused region, wherein the first and second diffused regions form the source and drain regions of the first transistor, and the second and third diffused regions form the source and drain regions of the second transistor.

7. The method of claim 5, wherein the step of forming a first conductor layer over the first shallow trench isolation and the source and drain regions of the first transistor and a second conductor layer over the second shallow trench isolation and the source and drain regions of the second transistor comprises growing a layer of epitaxial silicon over the substrate.

8. The method of claim 5, wherein the step of forming a first conductor layer over the first shallow trench isolation and a second conductor layer over the second shallow trench isolation comprises depositing a single layer of conductor material over the first shallow trench isolation and the second shallow trench isolation, wherein the single layer of conductor material overlaps the source and drain regions of the first transistor and the source and drain regions of the second transistor.

9. The method of claim 5, wherein depositing a first gate oxide over the first conductor layer and a second gate over the second conductor layer comprising depositing a single layer of gate oxide over both the first conductor layer and the second conductor layer.

10. The method of claim 5, further comprising forming a third conductor layer over and contiguous with one of the source and drain regions of the first transistor.

11. The method of claim 10, further comprising forming a fourth conductor layer over and contiguous with one of the source and drain regions of the second transistor.

* * * * *